United States Patent [19]

Giordano et al.

[11] Patent Number: 5,008,135
[45] Date of Patent: Apr. 16, 1991

[54] EPOXY FLUOROCARBON COATING COMPOSITIONS AND THE PROCESS TO MAKE THE SAME

[75] Inventors: Paul J. Giordano, Hudson; Richard C. Smierciak, Streetsboro, both of Ohio

[73] Assignee: The Standard Oil Company, Cleveland, Ohio

[21] Appl. No.: 554,933

[22] Filed: Jul. 18, 1990

Related U.S. Application Data

[63] Continuation of Ser. No. 334,736, Apr. 7, 1989, abandoned, which is a continuation of Ser. No. 186,673, Apr. 21, 1988, abandoned, which is a continuation of Ser. No. 856,625, Apr. 25, 1986, abandoned, which is a continuation-in-part of Ser. No. 777,890, Sep. 19, 1985, abandoned.

[51] Int. Cl.$^5$ .................... C08L 63/00; C08L 27/18
[52] U.S. Cl. .................... 427/386; 523/169; 523/435; 525/113; 525/121
[58] Field of Search ............ 523/169, 435; 525/113, 525/121; 427/386

[56] References Cited

U.S. PATENT DOCUMENTS

| | | | |
|---|---|---|---|
| 2,888,364 | 5/1959 | Bauer | 525/121 X |
| 2,979,418 | 4/1961 | Dipner | 525/144 X |
| 3,023,189 | 2/1962 | Jupa | 525/121 |
| 3,853,690 | 12/1974 | McGarry et al. | 428/422 X |

FOREIGN PATENT DOCUMENTS

| | | |
|---|---|---|
| 577019 | 6/1959 | Canada . |
| 1519010 | 11/1963 | Fed. Rep. of Germany . |
| 2122408 | 11/1972 | Fed. Rep. of Germany . |
| 2264132 | 12/1972 | Fed. Rep. of Germany . |
| 2396785 | 7/1977 | France . |
| 860299 | 2/1961 | United Kingdom . |
| 1031406 | 6/1966 | United Kingdom . |
| 1371349 | 10/1974 | United Kingdom . |

OTHER PUBLICATIONS

Chemical Abstracts, 92, 155874m (1980); Kondo et al., "Receptor Coatings for Electrostatic or Toner Images".
Chemical Abstracts, 95, 228088g (1981); Lazarz et al., "Wetting Agents in Rendering Hydrophobic Polymeric Separators Hydrophilic".
Chemical Abstracts, 96, 36293u (1982); Toshiba Corp., "Resin Molding Compositions".
Chemical Abstracts, 96, 55173w (1982); Oiles Industry Ltd., "Solid Lubricants".
Chemical Abstracts, 99, 196017x (1983); Toshiba Corp., "Printable Epoxy Resin Molding Compositions".
Chemical Abstracts, 100, 176522u (1984).
Billmeyer, *Textbook of Polymer Science*, 3d Ed., p. 402, Wiley, N.Y., 1984.
Textbook of Polymer Science, Fred W. Billmeyer, Jr., pp. 418–429.
"Cationic UV-Cure Cycloaliphatic Epoxy Systems Formulation Parameters and Curing Characteristics," *Polymers Paint Colour Journal,* vol. 176, No. 4171, Jul. 9, 1986.

*Primary Examiner*—Earl Nielsen
*Attorney, Agent, or Firm*—Larry W. Evans; Joseph G. Curatolo; Teresan W. Gilbert

[57] ABSTRACT

An epoxy fluorocarbon coating composition in the presence of a curing agent and, wherein the fluorocarbon polymer is about 5 to about 24 percent of the total weight of the coating composition and has a particle size less than 500 microns which has excellent corrosion resistance.

31 Claims, No Drawings

EPOXY FLUOROCARBON COATING COMPOSITIONS AND THE PROCESS TO MAKE THE SAME

CROSS REFERENCE

This is a continuation of co-pending application Ser. No. 07/334,736 filed on April 7, 1989, which is a continuation of application Ser. No. 186,673, filed in April 21, 1988 which is a continuation of application Ser. No. 856,625, filed on April 25, 1986, which is a continuation in part of application Ser. No. 777,890, filed on Sept. 19, 1985 now abandoned.

BACKGROUND OF THE INVENTION

The present invention is directed generally to epoxy fluoropolymer compositions for use as protective surface coatings on various substrates such as metal, wood, plastic, paper and the like. This invention relates to novel 100 percent solids epoxy fluoropolymer coating compositions. In another aspect, the invention relates to novel coating compositions and the process for producing the coating compositions which have excellent corrosion resistance and good adhesion as well as good release properties and hydrophobicity.

There is demand in the industry for protective coatings that will withstand the effects of a variety of severe environmental conditions. Many varieties of coating compositions are currently available that are based on various polymeric materials. Fluorocarbon polymers are generally thermoplastic with, however, a high melting point; thus there are significant economic and technical barriers that must be overcome when using them. However, polytetrafluoroethylene is not thermoplastic and therefore must be fabricated. Generally, in the fabrication process the resin is compacted to preform and then is sintered at temperatures above 700 degrees F. As such, using polytetrafluoroethylene is energy intensive and only simple shapes can be realized. Fluoropolymer coating compositions exhibit nonstick properties and adhesion to metal at temperatures around 700 degrees F. In accordance with this invention, it has been discovered that fluorocarbon polymers can be processed at ambient or relatively low temperatures.

Most coating systems used today are solvent based or water based. Solvent based coating are disadvantageous in that large amounts of volatile organic solvents are present. These solvents may be costly and hazardous. The solvents must be removed from the final coatings which required considerable thermal energy. Further, if hazardous, the solvents must be recovered or incinerated as they may not be exhausted into the environment. Water based coatings are disadvantageous in that they are not continuous and have been found to contain more pinholes and voids than the solvent based coatings.

As a result, the search for an essentially solvent-free coating process has led to the use of solventless systems. The advantages of a solventless coating system includes the minimization of surface defects due to the absence of solvents and excellent heat and chemical resistance.

It is an object of this invention to provide an epoxy fluoropolymer coating composition in a 100 percent solids, solvent free system to avoid use of cyclable solvents. It is another object of this invention to produce a corrosion resistant coating that is cured at ambient or relatively low temperatures. It is another object of this invention to form a coating composition with the excellent adhesion, good wetting, good cohesion, good hydrophobicity, excellent chemical resistance and good release properties. It is another object of this invention to produce a coating that is resistant to a variety of aggressive environmental conditions.

These and other objects, together with the advantages over known methods shall become apparent from the specifications which follows and are accomplished by the invention as hereinafter described and claimed.

SUMMARY OF THE INVENTION

We have found that a dispersion system of a fluorocarbon polymer in an epoxy resin results in a multifunctional coating system with improved properties. The present invention includes a solventless coating system based on the multi-functional epoxy resin which serves as a resinous vehicle prior to curing and as a matrix material after curing for the fluorocarbon polymer.

This invention relates to coating compositions comprising epoxy resins and fluorocarbon polymers, in particular polytetrafluoroethylene (PTFE), wherein the weight percent of the fluorocarbon polymer is about 5 to about 24 percent of the total weight of the coating composition and wherein the particle size or the fluorocarbon polymer is less than 500 microns, preferably less than or equal to 150 microns.

The invention further includes a process to produce said coating compositions comprising:
1. forming a dispersion of powdered fluorocarbon polymer in an epoxy resin,
2. adding a curing agent to the dispersion to form a mixture,
3. applying the mixture to a substrate to form a coating, and
4. curing the coating from about room temperature to about 150 degrees C.

The epoxy fluorocarbon polymer coating compositions of this invention can be used for industrial corrosion protection of substrates where coating properties such as hydrophobicity, good release properties, adhesion and corrosion resistance are important. Major uses for the coatings are in the chemical processing industry for reactors, stirrers, pipes and tankers. Further, the coating compositions may also be used in other fields such as anti-biofouling, anti-icing, electrical insulation and the like.

DETAILED DESCRIPTION OF THE INVENTION

The coating compositions of the instant invention are intimate, uniform dispersions of a fluorocarbon polymer in an epoxy resin, which is in the presence of a curing agent.

The coating compositions of the present invention contain an epoxy resin. Epoxy resins are characterized by the presence of a three-membered cyclic ether group commonly referred to as an epoxy group which is represented as follows:

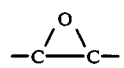

I

There are two commonly used classes of epoxy resins, diglycidyl ethers of bisphenol A and Novolak epoxy resins. Molecular weight and epoxide equivalent are controlled by varying the reactant ratios. The epoxy resin functions as a dispersing resinous vehicle and matrix for the fluorocarbon polymer. The coating compositions of the present invention are classified as 100 percent solids because they contain essentially no volatile solvents. The fluorocarbon polymer is uniformly dispersed in the epoxy resin resulting in a network of fluoropolymer which is homogeneously dispersed throughout the composite. However, minor amounts of solvents may optionally be used that may be volatile, which does not defeat the object of this invention, to provide a substantially 100 percent solid coating composition.

These epoxy resins can be employed in the coating composition either alone or in combination. The coatings compositions of the present invention generally contain, in percent of the total weight, from about 95 percent to about 70 percent and preferably from about 90 percent to about 75 percent of the epoxy resin.

The conventional epoxy resins are diglycidyl ethers of bisphenol A derived from bisphenol A (4,4'-isopropylidenediphenol) and epichlorohydrin. The reaction product is believed to have the form of a polyglycidyl ether of bisphenol A (the glycidyl group being more formally referred to as the 2,3-epoxypropyl group) and thus may be thou9ht of as a polyether derived from the diphenol and glycidyl (2,3-epoxy-1-propanol). The structure usually assigned to the resinous product is

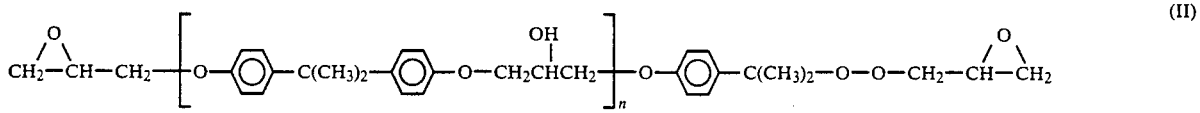

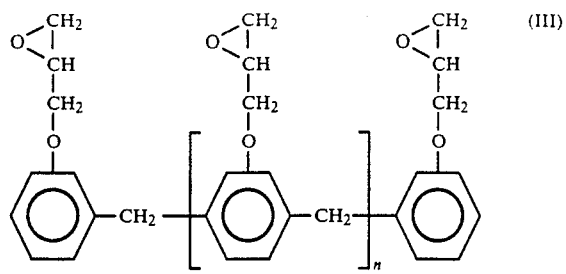

The Epoxy Novolak resin can range from a high viscosity liquid, (an example of which formula III, where n averages about 0.2) to a solid, (where the value of n in formula III is greater than 3).

Many other epoxide materials are available in polymerizeable monomeric or prepolymeric forms. Typical epoxide or polyepoxide materials include but are not limited to cyclohexene oxides, epoxidized cycloalkenes, glycidyl esters of acrylic acid, glycidyl alkyl ethers, glycidyl aryl ethers, esters of epoxidized cyclic acids, halogenated epoxides, styrene oxide, bisphenol F epoxides and the like.

The cyclohexene oxides and their derivatives and homologues useful as epoxide materials include but are not limited to cyclohexene oxide, 1,2-epoxycyclohexene, vinylcyclohexene dioxide, more specifically named 3-(epoxyethyl) -7- oxabicyclo (4.1.0) heptane, and 1,2-epoxy-4-(epoxyethyl)cyclohexane. Most preferred is cyclohexene oxide.

A viscous liquid epoxy resin, average molecular weight about 380, is obtained by reacting the epichlorohydrin in high molecular proportion relative to the bisphenol A, the reaction product containing well over 85 mole percent of the monomeric diglycidyl ether of bisphenol A (represented in formula II, where n=0), which may be named 2,2-bis(p-(2,3-epoxypropoxy)-phenyl)propane, and smaller proportions of units in which n is an integer equal to 1, 2, 3, etc. This product exemplifies epoxide monomers and prepolymers, having a moderate molecular weight, preferably of the order of 1,000 or less, which may be cross-linked or other wise polymerized in accordance with the invention. Solid diglycidyl ethers of bisphenol A are also useful epoxy resins for the instant invention. The structure is the same as above, in formula II, except the average value of n ranges from 1 to 20. High molecular weight diglycidyl ethers of bisphenol A are also useful for the instant invention. The molecular weight of the product is a function of the ratio of epichlorohydrin-bisphenol A. The average value of n ranges from 1 to 20 and as the n value becomes greater, the molecular weight of the resin increases.

The Novolak Epoxy resins are obtained by the known reaction of epichlorohydrin with a novolak resin. First, a phenol-formaldehyde type resin is obtained primarily by the use of acid catalysts and an excess of phenol. The Epoxy Phenol Novolak Resins are then prepared from the phenol-formaldehyde condensation products with subsequent epoxidation, utilizing epichlorohydrin. The structure usually assigned this resinous structure is The epoxidized cycloalkenes and their derivatives and homologues useful as epoxide materials include but are not limited to the derivatives of ethylene oxide, propylene oxide, trimethylene oxide, 3,3-bis(chloromethyl)oxetane, tetrahydrofuran, dicyclopentadiene dioxide, 1,3,5-trioxane, 2,3 epoxybutane, polycyclic diepoxide and 3,4-8,9-diepoxy tricyclo-[5.2.1.0$^{2,4}$]-decane. Most preferred is polycyclic diepoxide.

The glycidyl esters of acrylic acid and their derivatives and homologues include but are not limited to the glycidyl derivatives of methacrylic acid, acrylonitrile, crotonic acid, allylglycidyl ether, 1-allyloxyl-2,3-epoxypropane, glycidyl phenyl ether and 1,2-epoxy-3-phenoxypropane. Most preferred are epoxidized methacrylic acid and acrylonitrile.

The epoxidized alkylethers and their derivatives and homologues include but are not limited to glycidyl octyl ether, dicyl glycidyl ether, dodecyl glycidyl ether and glycidyl tetradecyl ether. Most preferred is glycidyl octyl ether.

The glycidyl aryl ethers and their derivatives and homologues include but are not limited to benzyl glycidyl ether, methyl benzyl glycidyl ether, dimethyl benzyl glycidyl ether, ethyl glycidyl ether. Most preferred is benzyl glycidyl ether.

Esters of epoxidized cyclic alcohols or of epoxidized cycloalkanecarboxylic acids or of both and their derivatives and homologues include but are not limited to esters of epoxidized cyclohexanemethanol and epoxidized cyclohexane-caboxylic acid such as diepoxide (3,4-epoxy-cyclohexyl)methyl 3,4-epoxycyclohexanecarboxylate, esters of a substituted (epoxycycloalkyl) methanol and a dibasic acid such as bis(3,4-epoxy-6-methylcyclohexyl)-methyl) adipate. Diepoxide monomeric materials may be obtained conveniently as bis-(epoxyalkyl) ethers of glycols, an example being the diglycidyl ether of 1,4-butanediol, that is, 1,4-bis-(2,3-epoxypropoxy)butane. We have found this diepoxide is related to the diglycidyl ether of bisphenol A, that is 2,2-bis-[p-(2,3-epoxypropoxy)-phenyl]propane.

Reactive diluents and their derivatives and homologues likewise may be used such as 1,2 epoxy dodecane and the like.

The second component of the coating compositions of the present invention is a fluorocarbon polymer. The fluorocarbon polymers according to this invention are not fused or sintered at 700 degrees F but rather the epoxy fluorocarbon compositions are cured at low temperatures, thus retaining good structural properties of hardness and durability. Further, when processed according to the invention, the fluorocarbon polymers do not need reinforcing agents to have good structural properties. The fluorocarbon polymers used are those of hydrocarbon monomers that are perfluorinated.

These fluorocarbon polymers can be employed in the coating composition either alone or in combination. The fluorocarbon polymers used are in powder or granular form. The coating compositions of the present invention generally contain, in percent of total weight, from about 5 percent to about 24 percent, preferably from about 10 percent to about 20 percent of powdered fluorocarbon polymers. The fluorocarbon polymers have a particle size less than 500 microns preferably less than or equal to 150 microns.

Typical fluorocarbon polymers include but are not limited to homologues and derivatives of polytetrafluoroethylene, Teflon FEP-a fluorinated ethylene propylene which is a copolymer of tetrafluoroethylene and hexafluoropropylene, Teflon ® TFE-tetrafluoroethylene, Teflon ® PFA-perfluoroalkoxy resin, Tefzel ®-modified copolymer of ethylene and tetrafluoroethylene and the like. Most preferred is polytetrafluoroethylene.

To effect crosslinking of the epoxy resin, the epoxy fluorocarbon mixture is cured by known epoxy resin curing methods. Epoxy resins may be cured both catalytically and stoichiometrically. The epoxy fluorocarbon mixture of the instant invention is cured at about 25 degrees C to about 150 degrees C and most preferably from about 85 degrees C to about 100 degrees C. The curing time is dependent on the temperature employed and the kinetics of the reaction to form the coating composition of the instant invention.

Catalytic curing agents are a group of compounds which promote epoxy reactions without being consumed in the process. The catalytic curing agents and the cure of the resin using these agents are generally well known in the art. The amount of catalyst used is about 1 to about 10 weight percent. This type of catalyst is activated by heat. A heating condition of about 80 degrees C is generally used. The upper limit of the heating temperature and the length of time of heating is dependent upon various factors such as the thermal deterioration point and decomposition point of the films and also by heat desirability of the object to be cured. The epoxy fluorocarbon mixture in the presence of the catalytic curing agents is indefinitely stable at room temperature so that the pot life of the system is extremely long. Acidic catalytic curing agents and include but are not limited to carboxylic acids, anhydrides, dibasic organic acids, phenols, Lewis acids, amine adducts, tertiary amines and others. Common catalytic curing agents include but are not limited to benzyldimethylamine, boron trifluoride monoethylamine, formic acid, benzoic acid, formic anhydride, acetic anhydride, oxalic acid, malonic acid, succinic acid, ortho-, meta-, para-cresol and the like.

Stoichiometric curing agents are a group of compounds in which the curing agents are consumed in the cure process. The stoichiometric curing agents and the cure of the resin using these agents are generally well known in the art. The rate of the reaction depends upon the chemistry of the stoichiometric curing agent and the epoxy resin. Tertiary amines and similar compounds can be used in conjunction with basic compounds to accelerate polymerization of the epoxy materials. The basic stoichiometric curing agents employed include but are not limited to Lewis bases, inorganic bases, primary and secondary amines, amides and others. Examples of suitable stoichiometric curing agents are polysulfides, in particular, mercapto terminated polyoxyethylene; aliphatic amines, in particular, cyclohexyl amine; polyamimes, in particular, triethylene tetramine; amidoamines, in particular, the reaction product of ethylene diamine with linoleic acid dimer; aromatic amines, in particular, aniline; anhydrides, in particular, proprionic anhydride; melamine-formaldehyde; urea-formaldehyde; phenol-formaldehydes, in particular, t-butyl phenol-formaldehyde and the like.

Another class of curing agents that may be employed are photoinitiated curing agents. The photoinitiator curing agents and the cure thereof are generally well known in the art. Examples of suitable photoinitiator curing agents include benzophenone, dye sensitizers, triaryl sulfonium salts, benzoin ethers, substituted acetophone, Michler's ketone, benzil and the like. The coating composition is cured by radiation in the range of ultraviolet to visible light. The light source emits wavelengths in the spectrum from about 1,000 Angstroms to about 6,000 Angstroms. The systems used to generate radiation for the photoinitiated cure can be any known in the art such as low pressure, medium pressure, high pressure or super high pressure mercury lamps; mercury, carbon and plasma arc lamps; xenon lamps; UV light emitting diodes; UV emitting lasers and the like. The coating mixture can also be cured using an electron beam apparatus. Further, the coating mixture can be cured by tungsten lamps, sunlight and the like.

The novel epoxy fluoropolymer coating compositions can optionally include but do not require the addition of plasticizers; silica; glass fiber; cloth; beads; powder; flake; graphite; silicon carbide; boron; metal rod; metal flake; metal oxides; natural fibers such as asbestos, wood and textiles; biologically active chemicals such as organotin compounds; alumina; boron nitride; plaster and portland cement. The coating compositions of the instant invention have improved results whether or not these components are employed.

It will be readily apparent to those skilled in the art that the coating compositions of the instant invention may be modified by the addition of plasticizers, stabilizers, pigments, dispersants, defoamers, surfactants, extenders, fillers, reinforcing agents and other film formers. The coating compositions of the instant invention may also optionally contain various flattening agents, surface active agents, thixotropic agents, UV light absorbers, flow control agents, viscosity agents, antioxidant agents and dyes. All these additives and the use thereof are well known in the art and do not require extensive discussion, it being understood that any compound possessing the ability to function in such a manner, i.e., as a flattening agent, surface active agent, UV light absorber and the like, can be used so long as they do not deleteriously affect the curing of the coating composition and do not adversely affect the characteristics of the coating. However, these components are not required.

It will be appreciated therefore that the epoxy resins, fluorocarbon polymers, curing agents and any other modifiers should be chemically compatible with each other.

In the practice of this invention, the coating composition precursor is first compounded by adding together the epoxy resins and the fluorocarbon polymers to form generally an intimate, uniform dispersion. To this dispersion is added the curing agents, with stirring to form a mixture. Optionally, at any step in the process prior to the cure, any of the aforementioned additives may be stirred into the mixture. The various components are thoroughly mixed so as to form a uniform dispersion mixture of the coating composition's components, in particular, the fluorocarbon polymers in the epoxy resins.

A relatively uniform film of coating mixture is applied onto a substrate by any of the known means such as wire wound rod, Guardco® wet film applicator rods, knife, bar, airless spraying, dipping, roller coating, flowing, brushing, conventional and/or electrostatic spray gun, electrodeposition and the like. The various substrates employed can be wood, paper, metal, pretreated metal, plastic and the like. Generally, the coating composition is applied in an amount sufficient to provide a dry cured coating thickness of from about 1 mil to about 100 mil, preferably from about 6 mil to about 26 mil. Optionally, multiple coats of the composition may be applied to the substrate. By selection of components and additives the coating compositions may be applied both as translucent coatings or opaque coatings.

The coating mixture is then cured and solidified to form the coating composition. After cure, there is present on the surface of the substrate a hard, non-tacky, non-mar adhesive and chemically resistant coating which tenaciously adheres to the substrate.

The coating compositions of the present invention can be patched if the coating is damaged by applying a fresh coat of the coating mixture over the defective area and then curing the coating mixture to form the coating.

The coating compositions of the present invention are comprised of a uniform dispersion of a fluorocarbon polymer in a polymerized epoxy resin matrix. It is theorized that in curing the fine homogeneous dispersion of the coating composition mixture, the fluorine containing molecules becomes incorporated throughout the epoxy network matrix due to the polymerization of the epoxy resin to epoxy resin trapping and physically holding the fluorine containing molecules in the matrix. The coating compositions superior properties are derived from the novel multifunctional combination of epoxy and fluorocarbon moeities resulting in excellent adhesion, good chemical resistance and wetting properties of the epoxy resins being retained together with excellent chemical resistance, hydrophobicity and release properties of the fluorocarbon polymers.

SPECIFIC EMBODIMENTS

The following examples demonstrate the process and advantages of the present invention.

Test Method

The following compositions 1-12, were prepared by dispersing the powdered polytetrafluoroethylene (PTFE) in the epoxy resin by stirring using a cowles dispersion method. To this dispersion, was added the curing agent. The compositions were prepared by mixing the listed components of the coating composition together to form a mixture. The resulting mixture was stirred to form generally a homogeneous mixture of the composition.

Coating compositions 1-10 were each then applied to the surface of 4"×6"×0.032" cold rolled steel untreated matte finished test panels. Coating composition 4 was applied to triplicate tests panels. Coated panels 1-10 were then cured for about four hours at about 85 degrees C.

Coating compositions 11, 12, A and B were each then applied to the surface of 4"×6"×3/16" cold rolled steel panels which had been blast cleaned to a NACE #1 white metal finish. Three coats of the compositions 11, 12, A and B were applied to warm test panels. Coating compositions 11, 12, A and B were then cured for about four hours at about 100 degrees C.

The thickness of the cured dry coatings were non-destructively measured bY an electronic probe based on magnetic conduction and eddy current. The thickness of coating compositions 1-10 were about 2 mil to about 4 mil. The thickness of coating compositions 11, 12, A and B were from about 6 mils. to about 10 mils.

All the test panels were subject to salt exposure (ASTM B 117) testing. Salt fog testing was carried out by masking with black tape uncoated portions of the test panel. Then the rest of the test panel was coated with the coating compositions and a large X was scribed in the dried coated panel. The panel was placed in a salt-fog cabinet for a given period of time. The cabinet induced accelerated corrosion testing through exposure of the samples to a warm salt-fog atmosphere. A rating was given based on the degree of rusting of the samples. Test ranges are 0 to 10, with a 0 rating for all rust and a 10 rating for no appreciable rust, furthermore, the scale is logarithmic between the two extreme endpoints. The results of the salt fog testing are shown in Table I.

The coating compositions 11, 12, A and B were also applied to five other identical test panels and were prepared, cured and applied to the test panels as described above. A test panel was attached horizontally to each end of a test cell, which consisted of a vertically oriented glass cylinder with a reflux condenser which can be capped at both ends by means of metal plates and about 4 inches outside diameter teflon washers. The cylinder was about three-quarters filled with a test solution and then heat was applied by means of a heating tape or heating girdle around the outside of the test cell. In this way, about a 3 inch circle of the bottom part of the coated test panel was immersed in refluxing test solution, while about a 3 inch circle of the top part of the coated test panel was exposed to a continuously condensing vapor phase of the test solution.

The test panels were run in the test cell at reflux temperature of the test solution for about 100 hours. The test solution used were 2.5 M Hydrochloric Acid solution, 5.0 M Sodium Hydroxide, Acetone, 2,2,4-

Trimethyl Pentane (Iso-octane) and Methyl Alcohol. A (+) positive rating was given if there was no corrosion and the coating was intact and a (—) negative rating was given if there was at least 80 percent corrosion present on the total exposed surface of the test panel. The results are shown in Table II.

Two of the test panels coated with coating composition Example 4 were subject to patachability testing. The coated test panels were forcefully hit using a ball-pein hammer resulting in about a one inch across irregular shaped jagged defect in the coating. The damaged areas were roughened using medium emery paper. A fresh coat of coating composition of Example 4 was prepared and applied by brush over the defective areas of the coating composition on both test panels. The two patched test panels were each cured, one was cured at room temperature for about five days and the other was cured for about four hours at about 100 degrees C.

| Coating Compositions | | |
|---|---|---|
| | Composition | Percent |
| Example 1 (comparative) | Shell Epon ® 828 Liquid Epoxy Resin* Polytetrafluoroethylene Triethylene Tetramine | 88.9 0 11.1 |
| Example 2 (comparative) | Shell Epon ® 828 Liquid Epoxy Resin* Polytetrafluoroethylene Triethylene Tetramine | 87.1 2.0 10.9 |
| Example 3 | Shell Epon ® 828 Liquid Epoxy Resin* Polytetrafluoroethylene Triethylene Tetramine | 84.4 5.0 10.6 |
| Example 4 | Shell Epon ® 828 Liquid Epoxy Resin* Polytetrafluoroethylene Triethylene Tetramine | 80.0 10.0 10.0 |
| Example 5 | Shell Epon ® 828 Liquid Epoxy Resin* Polytetrafluoroethylene Triethylene Tetramine | 75.6 15.0 9.4 |
| Example 6 | Shell Epon ® 828 Liquid Epoxy Resin* Polytetrafluoroethylene Triethylene Tetramine | 71.1 20.0 8.9 |
| Example 7 (comparative) | Dow Liquid Epoxy Novolak ® 431** Polytetrafluoroethylene Diethylene Tetramine | 79.7 0 20.3 |
| Example 8 (comparative) | Dow Liquid Epoxy Novolak ® 431** Polytetrafluoroethylene Diethylene Tetramine | 78.1 2.0 19.9 |
| Example 9 | Dow Liquid Epoxy Novolak ® 431** Polytetrafluoroethylene Diethylene Tetramine | 75.7 5.0 19.3 |
| Example 10 | Dow Liquid Epoxy Novolak ® 431** Polytetrafluoroethylene Diethylene Tetramine | 71.7 10.0 18.3 |
| Example 11 | Shell Epon ® 828 Liquid Epoxy Polytetrafluoroethylene Triethylene Tetramine | 80.0 10.0 10.0 |
| Example A | Shell Epon ® 828 Liquid Epoxy* Triethylene Tetramine | 89.0 11.1 |
| Example 12 | Dow Liquid Epoxy Novolak ® 431** Polytetrafluoroethylene Triethylene Tetramine | 72.0 10.0 18.0 |
| Example B | Dow Liquid Epoxy Novolak ® 431** Dow Epoxy Hardener 52 ®** | 80.0 20.0 |

*Available from Shell Oil Company, Chicago, Illinois, commercial grade.
**Available from Dow Chemical Company, Cleveland, Ohio, commercial grade.

Both cured test panels were then tested by the adhesion tape test. The adhesion tape test (ASTM D 3359=78}was carried out by applying a strip of standard tape to a cross-cut section previously made by a sharp tool in the patched coated substrate. The tape was then removed by briskly snapping it off. The amount of adhesion, of coating remaining on the substrate, was assessed on a 0 to 5 scale with no adhesion being 0 to 100 percent adhesion being no loss of coating and rated as a 5. The test results for both panels showed 100 percent adhesion on the patched area and thus rated at 5.

The following compositions C and D were prepared by a ball milling method. The laboratory ball mill consists of a steel cylinder which has an end that can be removed by threaded bolts. The cylinder was charged with approximately equal volumes of about 3/8" stainless steel balls and the composition. The cylinder was closed and the composition was dispersed by the rapid rotation of the cylinder on rollers. The steel balls rolled, abraded and impinged upon the composition physically beating it to smaller particle sizes.

Composition C contained about 43 weight percent Shell Epon ® 28 Liquid Epoxy Resin, about 10 weight percent cellosolve (available from Fischer Scientific, Cleveland, Ohio), about 2 weight percent FC-430-fluorosurfactant (available from 3M, St. Paul, Minn.) and about 20 weight percent DuPont DLX-6000 polytetrafluoroethylene with an average particle size of about 50 microns. This composition was ball-milled rotated for about hours. The composition dispersion formed was a smooth, fluid, pourable coating material Composition D contained about 43 weight percent Shell Epon ® 828 Liquid Epoxy Resin, about 10 weight percent cellosolve, about 2 weight percent FC-430-Fluorosurfactant and about 20 weight percent DuPont 8A polytetrafluoroethylene with an average particle size of about 500 microns. The composition was ball-milled rotated for about 8 hours. The composition dispersion was very poor, had a grainy texture and had the consistency of oatmeal. The ball mill was then closed and rotated for about 16 more hours. There was no improvement in quality of the composition dispersion after the second ball milling. Then about 10 weight percent of cellosolve wa added to reduce the viscosity of the composition. The ball mill was closed and rotated for about 8 hours. The composition dispersion was poor, very grainy and had the texture of oatmeal.

Composition C employing about 150 micron polytetrafluoroethylene produced a smooth usable well dispersed coating material with good rheological properties. Composition D employing about 500 micron polytetrafluoroethylene produced an unsuitable poorly dispersed coating material with poor rheological properties.

Coating composition E contained about 43 weight percent Shell Epon ® 828 Liquid Epoxy Resin, about 10 weight percent cellosolve, about 2 weight percent FC-430 fluorosurfactant, about 20 weight percent Dupont DLX-6000 micropowder polytetrafluoroethylene and about 25 weight percent 2:1 anchamine TL/TLS blend (available from Pacific Anchor Chemical Corp., Los Angeles, Calif.).

Coating composition F contained about 43 weight percent Shell Epon ® 828 Liquid Epoxy Resin, about 10 weight percent cellosolve, about 2 weight percent FC-430 fluorosurfactant, about 20 Weight percent titanium dioxide and about 25 weight percent 2:1 anchamine TL/TLS blend.

Compositions E & F were prepared by charging the components into a steel ball mill except for the anchamine curing agent and were dispersed for about 4 hours. The cylinder was charged with approximately equal volumes of about ⅜" stainless steel balls and the composition. Immediately prior to application of the coating on the substrate the curing agent is added to the composition. The coating compositions were then applied to the surface of cold rolled steel sandblasted to a 2 mil anchor particle, KTA-Tator panels (available from KTA-Tator Inc., Pittsburg, Pa.).

The test panels were roller coated until the resulting thickness equaled about a 20 mil coating. The coated panels were cured for about 15 minutes at about 80° C. between coats and followed by a postcure for about 4 hours at about 100° C.

The test panels were then attached horizontally to each end of a test cell, which consisted of a vertically oriented glass cylinder with a reflux condenser which can be capped at both ends by means of metal plates and about 4 inches outside diameter teflon washers. The cylinder was about three-quarters filled with 7M Hydrochloric Acid solution and then heat was applied by means of a heating tape or a heating girdle around the outside of the test cell. In this way, about a 3 inch circle of the bottom part of the coated test panel was immersed in refluxing test solution, while about a 3 inch circle of the top part of the coated test panel was exposed to a continuously condensing vapor phase of the test solution. The test panels were run in the test cell at reflux temperature of the 7M. Hydrochloric Acid at about 108° C. Samples of the hydrochloric acid test solution were taken at regular intervals and analyzed for parts per million iron. The samples were analyzed by Inductively Coupled Plasma Analysis for iron concentration in parts per million. The results are shown in Table III.

Results

The results of the novel coating compositions of the present invention demonstrate the critical weight percent loading range of about 5 percent to about 24 percent polytetrafluoroethylene in epoxy resin matrices. Within this range the chemical resistance of the coating compositions are improved, see examples 3, 4, 5, 6, 9 and 10. Below this range the coating compositions do not wet clean metallic substrates properly resulting in serious pinholes problems, see comparative examples 1, 2, 7 and 8. Above this range the coatings do not adhere well to metallic substrates and the rheological properties of the coating suffer such that at 25 percent loading Weight of polytetrafluoroethylene in the epoxy resin the polytetrafluoroethylene clumps and does not disperse evenly in the epoxy resin matrix so that it is difficult to coat the substrate with the coating.

The test results of the novel coating compositions of the present invention demonstrate excellent salt fog rating for up to 1,000 hours of exposure. In comparing example 11 and 12 with comparative example A and B, respectively it is readily apparent that the coating compositions of the instant invention shows superior corrosion resistance than the comparative coating compositions.

The test results of the novel coating compositions of the present invention demonstrate in continuously condensing vapor phase acid environments the epoxy polytetrafluoroethylene coating is intact and shows superior corrosion resistance as contrasted with the comparative coating compositions, see Table II. Further, the epoxy polytetrafluoroethylene coating results in an intact and non-corrosive coating in basic environments, thus performing as well as the corresponding comparative epoxy coatings.

The test results of the novel coating compositions of the present invention demonstrates the patchability at room temperature of the coatings.

The test results demonstrate that an epoxy fluorocarbon coating composition employing about 150 micron fluorocarbon polymer produces an improved smooth, well dispersed coating material with good rheological properties.

The results shown in Table III of the novel coatings composition of the instant invention demonstrates that the epoxy fluorocarbon coating is much more protective against corrosion resistance than a comparative epoxy titanium oxide coating in an acid environment.

Although the invention has been described in detail through the preceding examples, these examples are for the purpose of illustration only, and it is understood that variations and modifications can be made by one skilled in the art without departing from the spirit and the scope of the invention as hereinafter claimed.

TABLE I

Appearance of Surface Rust

| Composition | Percent PTFE | Rust Rating 100 hrs. | Rust Rating 1000 hrs. |
|---|---|---|---|
| c 1 | 0 | 6 | — |
| c 2 | 2.0 | 7 | — |
| 3 | 5.0 | 10 | — |
| 4 | 10.0 | 10 | — |
| 5 | 15.0 | 9 | — |
| 6 | 20.0 | 9 | — |
| c 7 | 0 | 2 | — |
| c 8 | 2.0 | 9 | — |
| 9 | 5.0 | 9 | — |
| 10 | 10.0 | 10 | — |
| 11 | 10.0 | — | 10 |
| A | 0 | — | 3 |
| 12 | 10.0 | — | 10 |
| B | 0 | — | 5 |

TABLE II

Environmental Exposure

| Composition | Hydrochloric Acid | Sodium Hydroxide | Acetone | Iso-octane | Methyl Alcohol |
|---|---|---|---|---|---|
| 11 | + | + | + | + | + |
| A | − | + | + | + | + |
| 12 | + | + | + | + | + |
| B | − | + | + | + | + |

TABLE III

Concentration of Iron

| Time (hrs.) | Composition E Epoxy/PTFE Coating Iron (mg/g) | Composition F Epoxy/TiO$_2$ Iron (mg/g) |
|---|---|---|
| 0 | 0 | <5 |
| 24 | 3 | <5 |
| 72 | 55 | 1100 |
| 144 | 340 | 2900 |
| 192 | 560 | 3800 |
| 238 | 820 | 5600 |
| 246 | 810 | 6200 |
| 384 | 3600 | — |

We claim:

1. A fluid coating composition comprising about 5 to about 24 percent by weight of a powdered fluorocarbon polymer wherein said florocarbon is non-melt processable and wherein said fluorocarbon has a particle size of less than 500 microns, dispersed in about 95 percent to about 70 percent by weight of an epoxy resin and an effective amount of a fluorosurfactant.

2. The coating composition of claim 1 wherein the powder fluorocarbon polymer has a particle size of less than or equal to 150 microns.

3. The coating composition of claim 1 wherein the coating composition is solvent free.

4. The coating composition of claim 1 wherein said composition comprises from about 10 to about 20 percent of powdered fluorocarbon polymer and from about 90 to about 75 percent of an epoxy resin.

5. The coating composition of claim 1 wherein said epoxy resin is selected from the group consisting of a diglycidyl ether of bisphenol A, epoxidized novolak cyclohexene oxide, epoxidized cycloalkene, glycidyl ester of acrylic acid, glycidyl alkyl ether, glycidyl aryl ether, ester of epoxidized cyclic alcohol, ester of epoxidized cycloalkanecarboxylic acid, halogenated epoxide, styrene oxide, bisphenol F epoxide and combinations thereof.

6. The coating composition of claim 5 wherein said epoxy resin is selected from the group consisting of diglycidyl ether of bisphenol A, epoxidized novolak and combinations thereof.

7. The coating composition of claim 1 wherein said fluorocarbon polymer is polytetrafluoroethylene.

8. The coating composition of claim 1 wherein said coating composition is cured at about 20° C. to about 150° C.

9. The coating composition of claim 1 wherein said coating composition is cured at about 80° C. to about 140° C.

10. The coating composition of claim 1 wherein said coating composition is cured at about 85° C. to about 100° C.

11. The coating composition of claim 1 wherein the epoxy resin is polymerized by a catalytic curing agent selected from the group consisting of benzyldimethylamine, boron trifluoride monoethylamine, formic acid, benzoic acid, formic anhydride, acetic anhydride, oxalic acid, malonic acid, succinic acid, ortho-cresol, meta-cresol, para-cresol and combinations thereof.

12. The coating composition of claim 1 wherein the epoxy resin is polymerized by a stoichiometric curing agent selected from the group consisting of polysulfide, polyamide, aliphatic amine, amidoamine, aromatic amine, anhydride, melamine-formaldehyde, urea-formaldehyde, phenol-formaldehyde and combinations thereof to form a coating.

13. The coating composition of claim 1 wherein said coating composition is cured by a photoinitiated curing agent selected from the group consisting of benzophenone, triaryl sulfonium salts, benzoin ether, substituted acetophenone, benzil and combinations thereof to form a coating.

14. A fluid coating composition comprising about 5 to about 24 percent by weight of a powdered fluorocarbon polymer wherein said fluorocarbon is non-melt processable and wherein said fluorocarbon has a particle size of less than 500 microns, wherein said fluorocarbon polymer is polytetrafluoroethylene which is dispersed in about 95 to about 70 percent by weight of an epoxy resin; wherein said epoxy resin is diglycidyl ether of bisphenol A and wherein a fluorosurfactant is in the dispersion to form a mixture and wherein the coating composition is cured by an agent selected from the group consisting of diethylenetetramine, and 4,4' methylene dianaline to form a coating.

15. The coating composition of claim 14 wherein said epoxy resin is diglycidyl ether or bisphenol A and the coating composition is cured by triethylene tetramine.

16. The coating composition of claim 14 wherein the coating composition is solvent free.

17. A process for preparing an epoxy fluorocarbon coating comprising:

a. forming a dispersion of a powdered fluorocarbon polymer wherein said fluorocarbon is non-melt processable polymer with a particle size of less than 500 microns in an epoxy resin,
b. adding a fluorosurfactant to the dispersion,
c. adding a curing agent to the dispersion to form a mixture wherein the mixture is in a fluid form,
d. applying the mixture to a substrate,
e. curing the mixture at about 20° C. to about 150° C. to form a coating.

18. The process of claim 17 wherein said coating is cured at about 80° C. to about 140° C.

19. The process of claim 17 wherein said coating is cured at about 85° C. to about 100° C.

20. The process of claim 17 wherein said fluorocarbon polymer is polytetrafluoroethylene.

21. The process of claim 17 wherein the powdered fluorocarbon polymer has a particle size less than or equal to 150 microns.

22. A process for patching an epoxy fluorocarbon coating comprising:

a. forming a dispersion of a powdered polytetrafluoroethylene polymer with a particle size less than 500 microns in an epoxy resin,
b. adding a fluorosurfactant to the dispersion,
c. adding a curing agent to the dispersion to form a mixture wherein the mixture is in the fluid form,
d. applying the mixture to the area lacking the coating on a substrate, and
e. curing the mixture at about 20° C. to about 150° C. to form a coating.

23. An article coated with the fluid composition comprising about 5 to about 24 percent by weight of a powdered polytetrafluoroethylene polymer with a particle size of less than 500 microns dispersed in about 95 to about 70 percent by weight of a epoxy resin and up to 2% of a fluorosurfactant.

24. The article coated with the composition of claim 23 wherein the powdered polytetrafluoroethylene polymer has a particle size less than or equal to 150 microns.

25. A coated article that is roller coated with a fluid composition comprising about 5 to about 24 percent by weight of a powdered polytetrafluoroethylene polymer with a particle size of less than 500 microns dispersed in about 95 to about 70 percent by weight of a epoxy resin and up to 2% fluorosurfactant.

26. The roller coated article of claim 25 wherein the powdered polytetrafluorethylene polymer has a particle size less than or equal to 150 microns.

27. A fluid coating composition comprising about 5 to about 24 percent by weight of a powdered polytetrafluoroethylene polymer with a particle size of less than 500 microns dispersed in about 95 to about 70 percent by weight of a polymerized epoxy resin and up to 2 percent of a fluorosurfactant.

28. A coating composition of claim 27 wherein the powdered polytetrafluoroethylene polymer has a particle size of less than or equal to 150 microns.

29. A process for preparing an epoxy fluorocarbon coating comprising:

a. forming a dispersion of a powdered polytetrafluoroethylene polymer with a particle size of less than 500 microns in an epoxy resin,
b. adding a fluorosurfactant to the dispersion,
c. adding a curing agent to the dispersion to form a mixture wherein the mixture is in a fluid form,
d. applying the mixture to a substrate, and e. curing the mixture at about 20° C. to about 150° C. to form a coating.

30. The process of claim 29 wherein the powdered polytetrafluoroethylene polymer has a particle size of less than or equal to 150 microns.

31. The coating composition of claim 1 wherein said composition comprises up to 2 percent of fluorosurfactant.

* * * * *